United States Patent
Kwan et al.

(10) Patent No.: US 7,646,253 B2
(45) Date of Patent: Jan. 12, 2010

(54) FREQUENCY-LOCKED CLOCK GENERATOR

(75) Inventors: Tom W. Kwan, Cupertino, CA (US); Ning Li, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 144 days.

(21) Appl. No.: 11/436,570

(22) Filed: May 19, 2006

(65) Prior Publication Data

US 2008/0068091 A1      Mar. 20, 2008

(51) Int. Cl.
*H03L 7/00* (2006.01)
(52) U.S. Cl. .......................... 331/1 R; 331/16; 331/17; 331/177 R
(58) Field of Classification Search .................. 331/1 R, 331/16, 17, 177 R See application file for complete search history.

(56) References Cited

U.S. PATENT DOCUMENTS 6,614,313 B2 *   9/2003   Crofts et al. ................ 331/1 R

* cited by examiner

*Primary Examiner*—Arnold Kinkead
(74) *Attorney, Agent, or Firm*—Sterne, Kessler, Goldstein & Fox

(57) ABSTRACT

A frequency-locked clock generator includes a voltage-controlled oscillator (VCO), a frequency-to-current converter, a reference current source and a gain stage. The VCO generates an output signal. The frequency-to-current converter generates a converter current proportional to a frequency of the output signal. The reference current source generates a reference current. The gain stage generates a control signal based on a difference between the converter current and the reference current. The control signal is applied to the VCO to adjust the frequency of the output signal. Feedback forces the VCO to generate an output clock signal such that the corresponding current it produces (i.e., the converter current) is equal to the reference current. When in lock, the frequency of the output signal is determined by a time constant (or equivalent time constant) of the frequency-locked clock generator.

17 Claims, 6 Drawing Sheets

FREQUENCY-LOCKED CLOCK GENERATOR

BACKGROUND OF THE INVENTION

1. Field of the Invention

The present invention generally relates to clock generators. More specifically, the present invention provides a frequency-locked clock generator having improved jitter and updating performance for large divider ratios.

2. Related Art

Often, a phase-locked loop (PLL) is used to generate an output clock signal from a given input signal having a reference frequency. The frequency of the output signal compared to the frequency of the input signal is considered the divider ratio of the PLL. The reference input signal is generally a relatively low frequency signal generated by an expensive crystal oscillator.

The loop bandwidth of the PLL is limited by the frequency of the input reference signal. Consequently, the updating performance of the PLL is impaired when a low frequency reference signal is used to generate a high frequency clock signal. Specifically, for large divider ratios, the limited loop bandwidth may prevent adequate updating of the output clock signal. In turn, the jitter performance of the PLL suffers. Overall, the PLL is an expensive design that provides poor performance in terms of slow response/updating time and jitter control when used to generate a high frequency output clock signal from a low frequency input signal.

BRIEF SUMMARY OF THE INVENTION

Accordingly, the present invention is directed to a reduced cost clock generator that produces an accurate and stable output signal having improved jitter and updating performance for large divider ratios.

In one embodiment, there is provided a frequency-locked clock generator having a voltage-controlled oscillator (VCO), a frequency-to-current converter, a reference current source and a gain stage. The VCO generates an output signal having a frequency that is adjustable. The frequency-to-current converter generates a converter current proportional to the frequency of the output signal. The reference current source, coupled to the frequency-to-current converter, generates a reference current. The gain stage generates a control signal based on a difference between the converter current and the reference current. The control signal is applied to the VCO to adjust the frequency of the output signal. Overall, the feedback of the frequency-locked clock generator forces the VCO to generate an output clock signal such that the corresponding current it produces (i.e., the converter current) is equal to the reference current. When in lock, the frequency of the output signal is determined by a time constant (or equivalent time constant) of the frequency-locked clock generator. The time constant is determined by the frequency-to-current converter and the reference current source.

In an alternative embodiment, there is provided a method for generating a frequency-locked clock signal. A feedback signal based on an output signal is generated. A converter current proportional to a frequency of the feedback signal is generated. The converter current is compared to a reference current to determine an error signal. A control signal is generated based on the error signal. The control signal is used to adjust a frequency of the output signal so as to minimize the error signal. The frequency of the output signal is locked to a time constant (or equivalent time constant) when the error signal is substantially equal to zero.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

Figure 5:
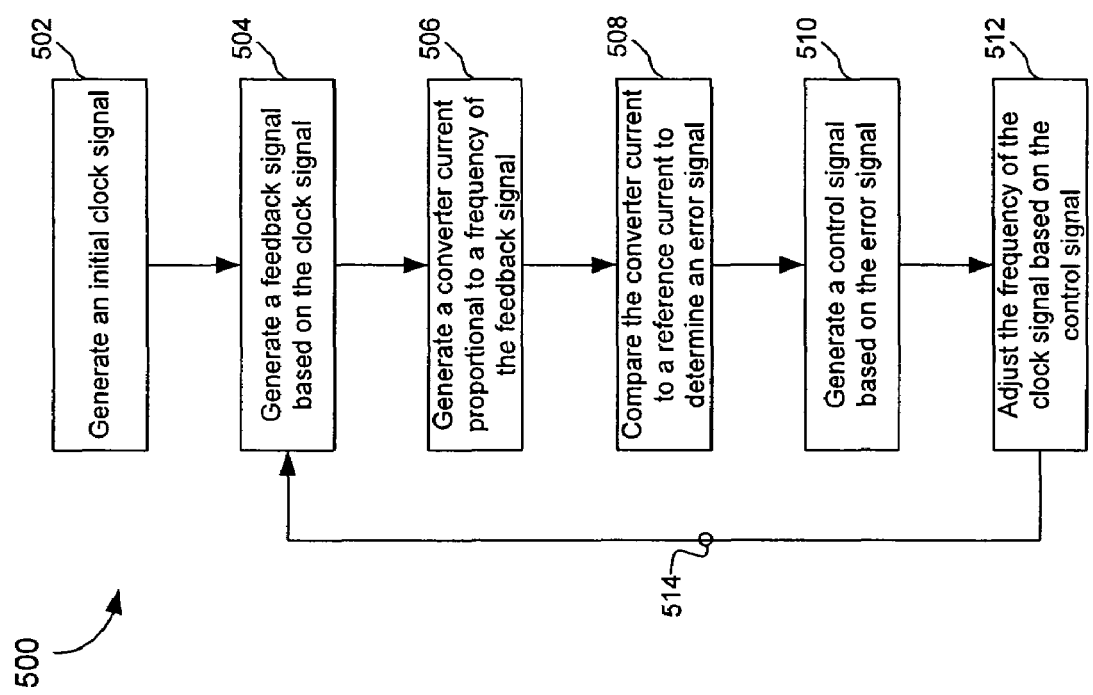

FIG. 5 provides a flowchart that illustrates operational steps for generating a frequency-locked clock signal in accordance with an aspect of the invention.

Figure 6:
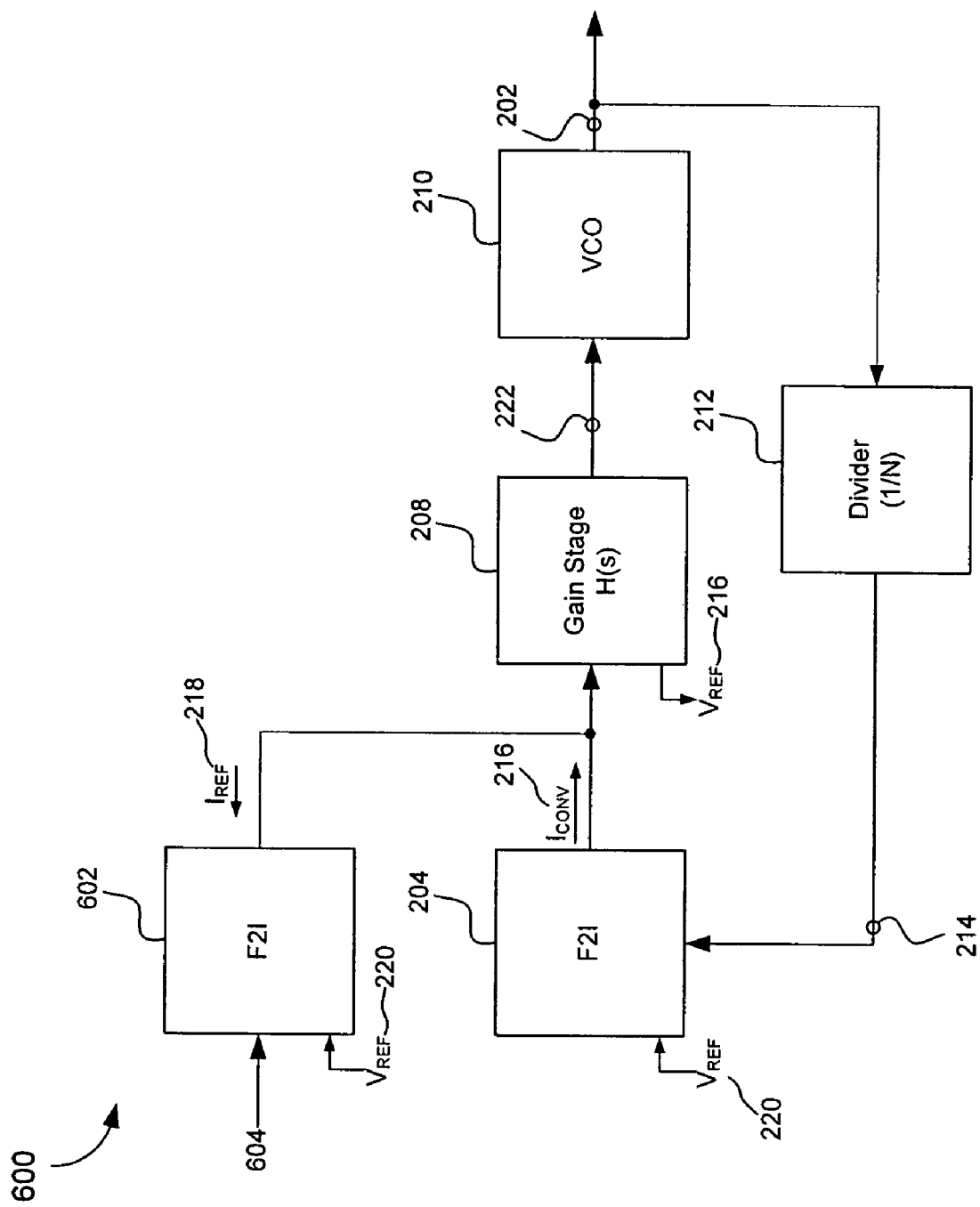

FIG. 6 illustrates a frequency-locked generator using a reference frequency in accordance with an aspect of the present invention.

DETAILED DESCRIPTION OF THE INVENTION

Figure 1:
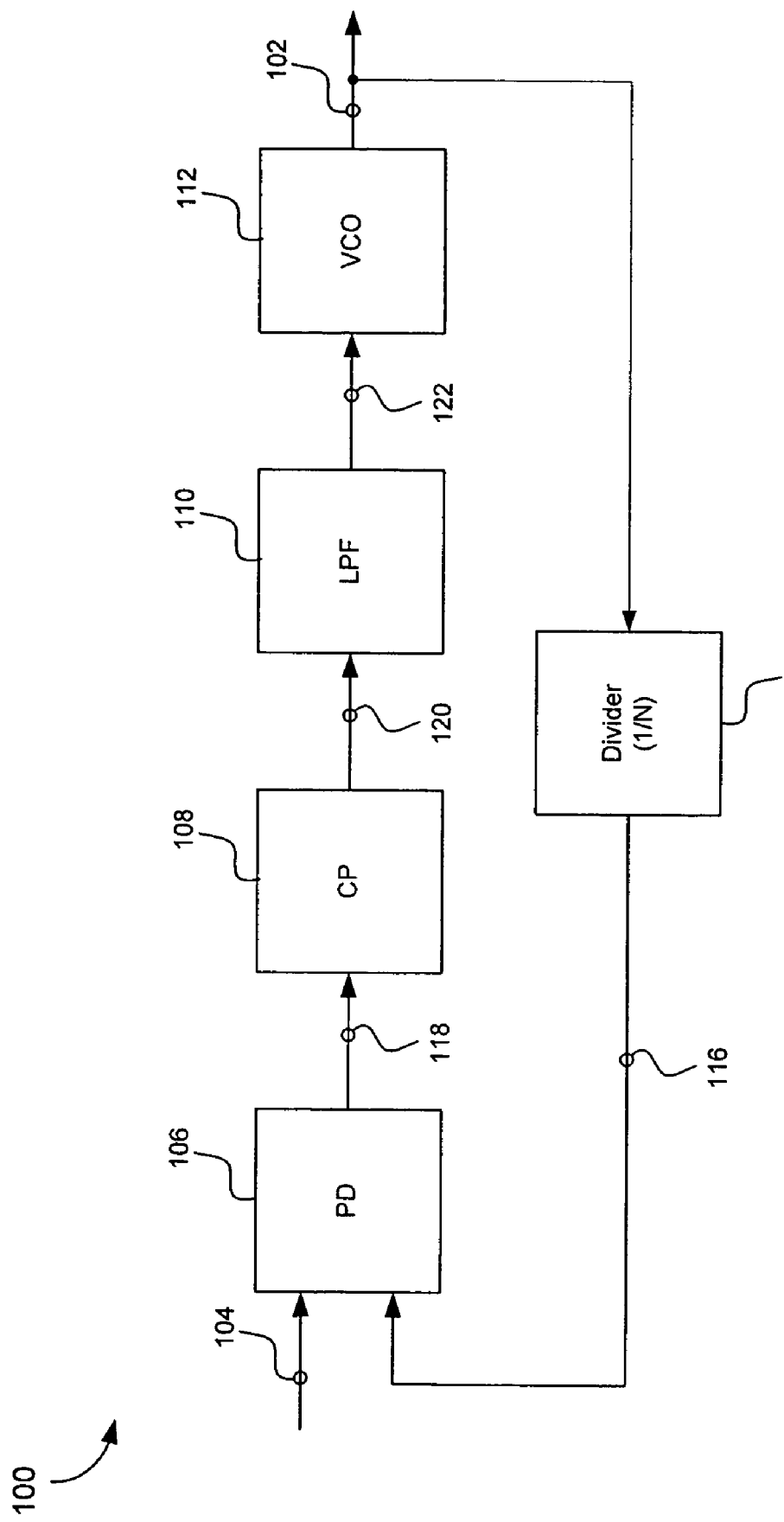
FIG. 1 illustrates a conventional phase-locked loop (PLL).

FIG. 1 illustrates a conventional phase-locked loop (PLL) 100. In general, the conventional PLL 100 is used to generate an output signal 102 having a desired output frequency (i.e., $f_{out}$) from an input signal 104 having a given reference frequency (i.e., $f_{ref}$). Often, the output signal 102 is a relatively high frequency signal and the input signal 104 is a relatively low frequency signal (i.e., $f_{out} > f_{ref}$). Accordingly, the conventional PLL 100 is used to generate the high frequency output signal 102 from the lower frequency input signal 104. The input signal 104 can be considered a reference clock.

As shown in FIG. 1, the conventional PLL 100 includes a phase detector (PD) 106, a charge pump (CP) 108, a low pass filter (LPF) 110, a voltage-controlled oscillator 112 and a frequency divider 114. The conventional PLL 100 is arranged as a negative feedback system. An output of the VCO 112 provides the output signal 102. The frequency divider 114 generates a comparison signal 116 based on the output signal 102. Specifically, the frequency divider 114 reduces the frequency of the output signal 102 by a divider factor, N, such that a frequency of the comparison signal 116 approximately equals the frequency of the input signal 104. Accordingly, the frequency of the output signal 102 is greater than the frequency of the input signal 104 by an amount equal to the divider factor or ratio, N (i.e., $f_{out} = N \cdot f_{ref}$).

The phase detector 106 generates an evaluation signal 118 based on a comparison of the phases of the input signal 104 and the comparison signal 116. The charge pump 108 converts the evaluation signal 118 into an adjustment signal 120. The LPF 110 filters the adjustment signal 120 to produce a filtered adjustment signal 122. The filtered adjustment signal 122 is applied to the VCO 112. The filtered adjustment signal 122 is used to adjust the frequency of the output signal 102 to correct for any phase difference between the input signal 104 and the comparison signal 116. In this way, the conventional PLL 100 uses feedback to continuously monitor and adjust the frequency of the output signal 102.

The input signal 104 is typically provided by a crystal oscillator. The crystal oscillator is an expensive component required by the conventional PLL 100. The loop bandwidth of the conventional PLL 100 is limited by the input reference clock 104. Typically, the loop bandwidth is limited to approximately one-tenth of the frequency of the input signal 104.

The constraint placed on the loop bandwidth of the conventional PLL 100 by the reference clock 104 is particularly problematic when it is desired to generate an output signal 102 having a frequency that is much greater than the frequency of the input signal (i.e., $f_{out} \gg f_{ref}$). When a large divider ratio, N, is needed to generate the output signal 102, the loop bandwidth of the conventional PLL 100 becomes insufficient. Specifically, the conventional PLL 100 is unable to update the operation of the VCO 112 quickly enough in response to the continuous generation of the output signal 102. That is, the updating operations of the conventional PLL 100 become so infrequent, when compared to the frequency of the output signal 102, that the VCO 112 is considered to be free-running. In turn, the jitter performance of the conventional PLL 100 suffers. Overall, the conventional PLL 100 is an expensive design that provides poor performance in terms of slow response/updating time and jitter control for large divider ratios.

Accordingly, there is a need for a reduced cost clock generator that produces an accurate and stable output signal having improved jitter and updating performance for large divider ratios.

Figure 2:
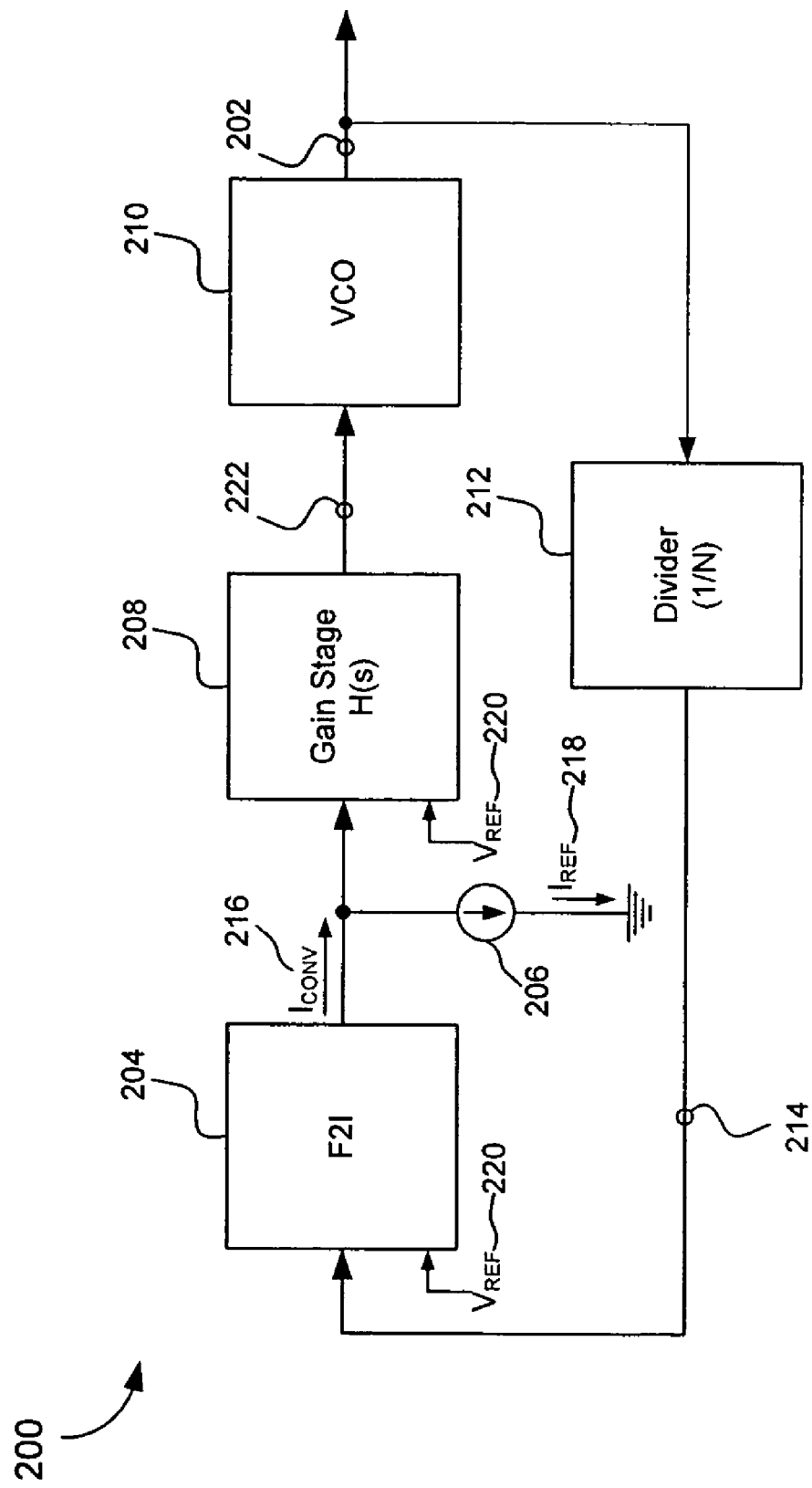
FIG. 2 illustrates a frequency-locked loop (FLL) clock generator of the present invention.

FIG. 2 illustrates a frequency-locked loop (FLL) clock generator 200 of the present invention. The frequency-locked clock generator 200 can be fabricated on an integrated circuit (IC) chip. The frequency-locked clock generator 200 produces an output signal 202 at a desired frequency. The frequency of the output signal 202 is determined by a reference voltage, a reference current and a reference capacitor value rather than a reference frequency or clock. As a result, the frequency-locked clock generator 200 enables the low cost generation of the output signal 202 with improved jitter and updating performance for large divider ratios.

As shown in FIG. 2, the frequency-locked clock generator 200 includes a frequency-to-current (F2I) converter 204, a reference current source 206, a gain stage 208, a VCO 210 and an optional frequency divider 212. A reference voltage 220 ($V_{ref}$) provides a bias voltage to the gain stage 208. The frequency divider 212 generates a feedback signal 214 based on the output signal 202. Specifically, the frequency divider 212 reduces the frequency of the output signal 202 (i.e., $f_{out,202}$) by a divider factor, N. Accordingly, the frequency of the output signal 202 is greater than the frequency of the feedback signal 214 (i.e., $f_{fdbk,214}$) by a factor equal to the divider factor or ratio, N (i.e., $f_{out,202}=N \cdot f_{fdbk,214}$). Absent the frequency divider 212 (e.g., N=1), the feedback signal 214 is identical to the output signal 202.

The output signal 202 can be considered the clock signal or clock generated by the frequency-locked clock generator 200. The output signal 202 can therefore be considered a frequency signal. Likewise, the feedback signal 214 can be considered a frequency signal. The F2I converter 204 uses the feedback frequency signal 214 to generate a converter current 216 ($I_{conv}$). The converter current 216 is proportional to the frequency of the feedback frequency signal 214.

As further shown in FIG. 2, the gain stage 208 includes a first input coupled to the reference voltage 220. A second input of the gain stage 208 is coupled to the output of the F2I converter 204 and the reference current source 206. The reference current source 206 generates a reference current 218 ($I_{ref}$). The gain stage 208 compares the converter current 216 to the reference current 218 and generates a control signal 222 based on any difference or error between the converter current 216 and the reference current 218. The control signal 222 is used to vary the frequency of the VCO output signal 202, $f_{out,202}$. In this way, the frequency-locked clock generator 200 uses feedback to adjust the frequency of the output signal 202.

As previously mentioned, when the frequency-locked clock generator 200 is in lock, the frequency of the output signal 202 is determined by the reference voltage 220, the reference current 218 and a reference capacitor value. Specifically, the frequency of the output signal 202 is equal to:

$$f_{out,202} = \frac{N}{\left(\frac{V_{REF}}{I_{REF}}\right)C} \qquad \text{Eq. 1}$$

when the frequency divider 212 is used and C represents a capacitance value of the frequency-locked clock generator 200. Alternatively, the frequency of the output signal 202 is equal to:

$$f_{out,202} = \frac{1}{\left(\frac{V_{REF}}{I_{REF}}\right)C} \qquad \text{Eq. 2}$$

when the frequency divider 212 is absent (i.e., N=1).

The reference current 218 can be generated from the reference voltage 220 using a reference resistor, R. Under this scenario, the frequency of the output signal 220 is locked to a time constant such that:

$$f_{out,202} = \frac{N}{RC} \qquad \text{Eq. 3}$$

when the frequency divider 212 is used and where $R=V_{REF}/I_{REF}$. When the frequency divider 212 is absent, N=1 in Eq. 3.

The values of the reference current 218, the reference voltage 220, and the capacitor value C can be adjusted or trimmed during operation of the frequency-locked clock generator 200 to fine-tune the frequency of the output signal 202 without the need for off-chip components.

By tying or locking the frequency of the output signal 202 to the reference voltage 220, the reference current 218 and the capacitor value C, the frequency-locked clock generator 200 reduces jitter in the output signal 202. Further, the frequency-locked clock generator 200 saves space and reduces costs since a reference clock is not required. Additionally, the loop bandwidth of the frequency-locked clock generator 200 is not limited or constrained by a reference clock. Consequently, the loop bandwidth of the frequency-locked clock generator 200 can be made large to ensure adequate up-dating and adjustment of the VCO 210.

Figure 3:
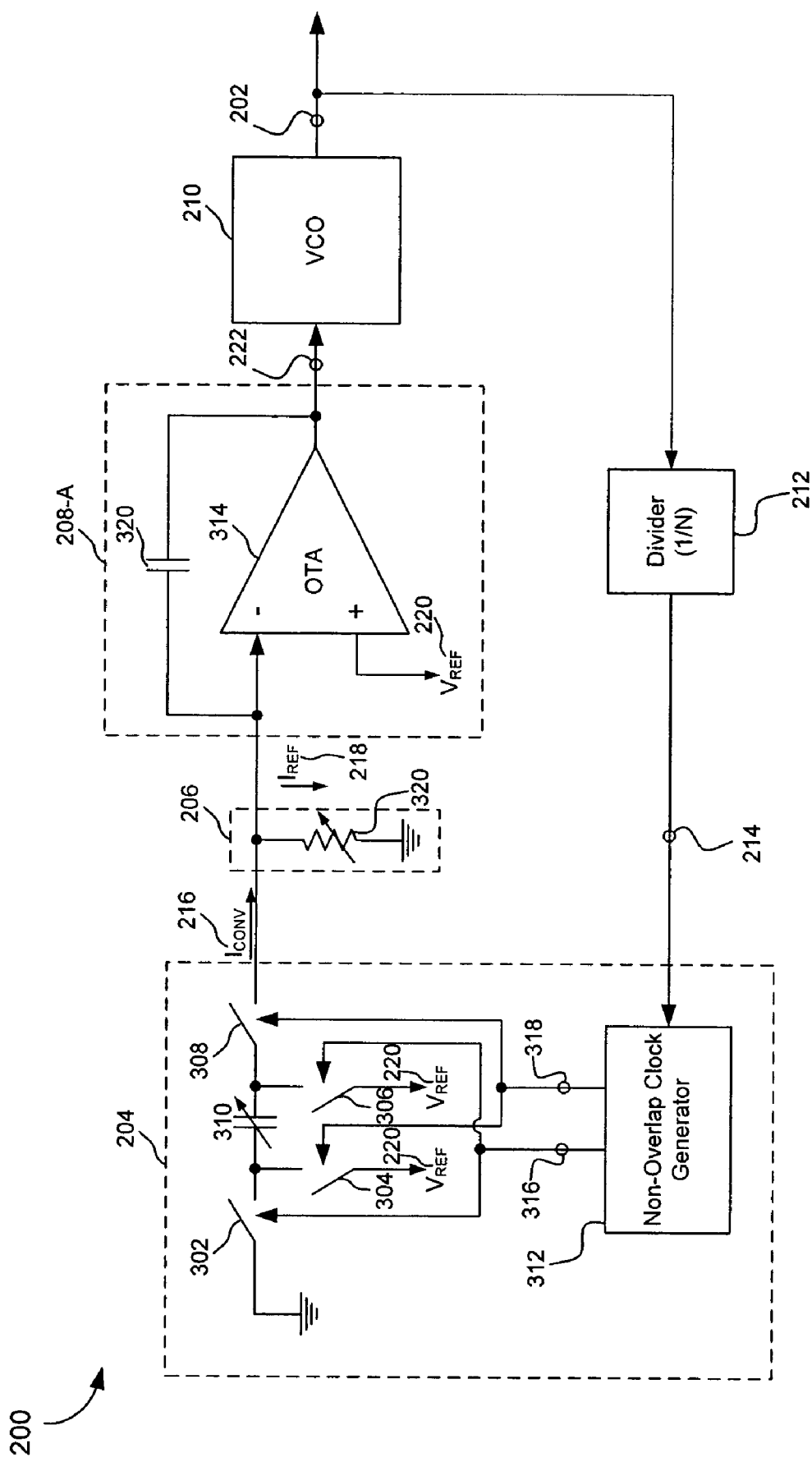
FIG. 3 illustrates an embodiment of the frequency-locked clock generator depicted in FIG. 2.

FIG. 3 illustrates an embodiment of the frequency-locked clock generator 200 of the present invention. As shown in FIG. 3, the F2I converter 204 is configured as a switched capacitor circuit. The reference current source 206 generates the reference current 218 using a resistor 320. The resistor 320 can be implemented using, for example, a transistor such as, for example, a Metal-Oxide Semiconductor Field-Effect Transistor (MOSFET). The resistor 320 can also be realized using a poly-resistor commonly available in Complementary MOS (CMOS) processes. Alternatively, the resistor 320 can represent a resistance of a MOSFET configured as a current source. The gain stage 208-A is configured as an integrator using an operational transconductance amplifier (OTA or op-amp) 314. As such, the gain stage 208-A has a very high gain at DC. The integrator gain stage 208-A represents a possible implementation of the gain stage 208 depicted in FIG. 2. A non-inverting input of the op-amp 314 is coupled to the reference voltage 220. An inverting input of the op-amp 314 is coupled to an output of the op-amp through a capacitor 320.

The F2I converter 204 includes a first switch 302, a second switch 304, a third switch 306, a fourth switch 308, a capacitor 310, and a non-overlapping clock generator 312. The switches 302-308 can be implemented using transistors such as, for example, MOSFETs. A first terminal of the first switch 302 is coupled to a ground. A second terminal of the first switch 302 is coupled to a first terminal of the capacitor 310. A first terminal of the second switch 304 is coupled to the reference voltage 220. A second terminal of the second switch 304 is coupled to the first terminal of the capacitor 310. A first terminal of the third switch 306 is coupled to the reference voltage 220. A second terminal of the third switch 306 is coupled to a second terminal of the capacitor 310. A first terminal of the fourth switch 308 is coupled to the second terminal of the capacitor 310. A second terminal of the fourth switch is coupled to the inverting input of the op-amp 314.

The non-overlapping clock generator 312 uses the feedback frequency signal 214 to generate a first clock signal 316 and a second clock signal 318. The first clock signal 316 and the second clock signal 318 are non-overlapping clock signals having the same frequency but opposite phase.

The first clock signal 316 controls the first switch 302 and the third switch 306. The second clock signal 318 controls the second switch 304 and the fourth switch 308. The first switch 302 and the third switch 306 form a first pair of switches. The second switch 304 and the fourth switch 308 form a second pair of switches. Only one pair of switches is activated or latched at any given time due to the non-overlapping nature of the clock signals 316 and 318. Specifically, during approximately a first half cycle of the feedback frequency signal 214, the clock signal 316 activates the first switch 302 and the third switch 306. When the first switch 302 and the third switch 306 are activated, the capacitor 310 is charged by the reference voltage 220. The second switch 304 and the fourth switch 308 are deactivated when the first switch 302 and the third switch 306 are activated.

During approximately a second half cycle of the feedback frequency signal 214, the clock signal 318 activates the second switch 304 and the fourth switch 308. When the second switch 304 and the fourth switch 308 are activated, the capacitor 310 is coupled to the inverting input of the op-amp 314. The capacitor 310 is discharged when the second switch 304 and the fourth switch 308 are activated. The first switch 302 and the third switch 306 are deactivated prior to the activation of the second switch 304 and the fourth switch 308 are activated. Likewise, the second switch 304 and the fourth switch 308 are deactivated prior to activation of the first switch 302 and the third switch 306.

By alternating the activation and deactivation of the first and second pair of switches, the capacitor 310 is successively charged and discharged. As a result, the F2I converter 204 produces an average converter current 216 equal to:

$$I_{CONV} = C_{310} \cdot V_{REF} \cdot f_{fdbk,214} \quad \text{Eq. 4}$$

$$= C_{310} \cdot V_{REF} \cdot \frac{f_{out,202}}{N} \quad \text{Eq. 5}$$

where $C_{310}$ represents a capacitance of the capacitor 310. The converter current 216 flows in the direction of the inverting input of the op-amp 314. As shown in Eq. 4 and Eq. 5, the converter current 216 is proportional to how quickly the capacitor 310 is charged and discharged (i.e., the frequency of the feedback signal 214) and the value of the reference voltage 220.

The op-amp 314 generates the control signal 222 by integrating the difference between the converter current 216 and the reference current 218. In this way, any error between the converter current 216 and the reference current 218 is used to adjust a frequency of the output signal 220 using negative feedback. Specifically, if the converter current 216 is greater than the reference current 218, then the control signal 222 responds by reducing the frequency of the output signal 202. Alternatively, if the converter current 216 is less than the reference current 218, then the control signal 222 responds by increasing the frequency of the output signal 202.

Over time, the error between the converter current 216 and the reference current 218 is reduced by the gain stage 208-A. When the frequency-locked clock generator 200 is in lock, the converter current 216 is equal to the reference current 218. During lock, the op-amp 314 has driven the voltage at the inverting input of the op-amp 314 to the voltage at the non-inverting input (i.e., the reference voltage 220). As a result, the potential across the resistor 320 is approximately equal to the reference voltage 220. Accordingly, the frequency of the output signal 202 can be shown to be:

$$I_{REF} = I_{CONV} \quad \text{Eq. 6}$$

$$\frac{V_{REF}}{R} = C_{310} \cdot V_{REF} \cdot \frac{f_{out,202}}{N} \quad \text{Eq. 7}$$

$$f_{out,202} = \frac{N}{RC_{310}} \quad \text{Eq. 8}$$

when the frequency divider 212 is used, where R is equal to a resistance value of the resistor 320. Alternatively, when the frequency divider 212 is not used (i.e., N=1), it can be shown that the frequency of the output signal 202 is equal to:

$$f_{out,202} = \frac{1}{RC_{310}} \quad \text{Eq. 9}$$

Eqs. 8 and 9 show that the frequency of the output signal 202 is well defined and, more specifically, equal to a multiple of the time constant of the frequency-locked clock generator 200 when in lock. It is important to note that the difference between Eq. 8 and Eq. 1 (and Eq. 9 and Eq. 2) is that the $V_{REF}/I_{REF}$ ratio of Eq. 1 (and Eq. 2) is realized by using the resistor 320 such that $R=V_{REF}/I_{REF}$ (e.g., R can be the DC equivalent resistance of the reference current source 206). Accordingly, Eqs. 8 and 9 show that the frequency of the output signal 202 is locked to a time constant of the frequency-locked clock generator 200 while Eqs. 1 and 2 show that the frequency of the output signal 202 is locked to an equivalent time constant of the frequency-locked clock generator 200.

As previously mentioned, the capacitor 310 and the resistor 320 determine the time constant of the frequency-locked clock generator 200. The capacitor 310 is shown as a variable capacitor to indicate that the value of the capacitor 310 can be varied during operation of the frequency-locked clock generator 200. Specifically, the variable capacitor 310 can be implemented as a bank of switch-controlled capacitors (e.g., a capacitor array) that can be individually added or removed to increase or decrease the value of the variable capacitor 310. Accordingly, the constituent capacitors comprising the variable capacitor 310 can be can be similarly-valued capacitors, differently-valued capacitors or binary ratio capacitors.

Likewise, the resistor 320 is shown as a variable resistor to indicate that the value of the resistor 320 can be varied during operation of the frequency-locked clock generator 200. Specifically, the variable resistor 320 can be implemented as a bank of switch-controlled resistors that can be individually added or removed to increase or decrease the value of the variable resistor 320. Accordingly, the constituent resistors comprising the variable resistor 320 can be can be similarly-valued resistors, differently-valued resistors or binary ratio resistors. Alternatively, the variable resistor 320 can be implemented as one or more MOSFETs providing adjustable resistance by varying the biasing of the one or more MOSFETs.

As previously mentioned, the frequency-locked clock generator 200 is configured as a negative feedback system. The gain stage 208 uses any error between the converter current 216 and the reference current 218 to adjust the value of the converter current 216. Overall, the feedback of the frequency-locked clock generator 200 forces the VCO 210 to generate an output clock signal 202 such that the corresponding current it produces (i.e., the converter current 216) is equal to the reference current 218. Accordingly, the frequency of the clock signal 202 can be adjusted by varying the reference current 218.

The frequency-locked clock generator 200 provides a clean output clock 202 without the use of a crystal oscillator to provide a reference frequency. The output clock 202 is frequency-locked to a programmable time constant. Specifically, the time constant, and therefore the frequency of the output signal 202, can be adjusted by varying the value of the capacitance associated with the F2I converter 204 and/or the value of the resistance associated with the reference current source 206. Further, the value of the capacitance associated with the F2I converter 204 and the value of the resistance associated with the reference current source 206 can be made to be very accurate. In turn, the frequency of the output signal 202 can be made very accurate. Additionally, the loop bandwidth of the frequency-locked clock generator 200 can be made very large to ensure the VCO 210 is adequately updated.

Figure 4:
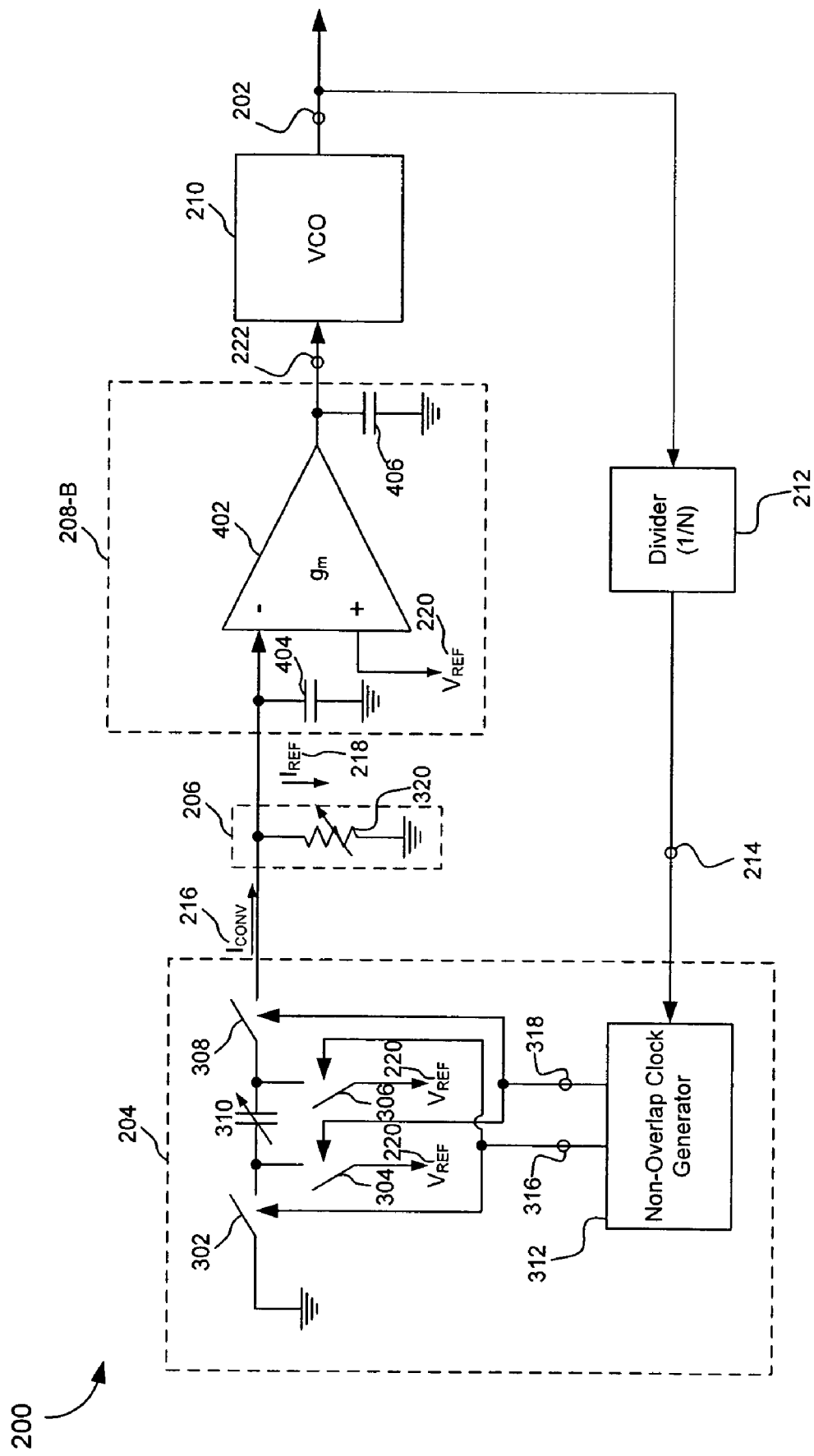
FIG. 4 illustrates a second embodiment of the frequency-locked clock generator depicted in FIG. 2.

FIG. 4 illustrates an alternative embodiment of the frequency-locked clock generator 200 of the present invention. Specifically, FIG. 4 illustrates an alternative embodiment of the gain stage 208 depicted in FIG. 2. As shown in FIG. 4, the gain stage 208-B is implemented as a $g_m/C$ gain stage using a transconductor 402, an input capacitor 404 and an output capacitor 406. The input capacitor 404 is coupled to an inverting input of the transconductor 402. The reference voltage 220 is coupled to a non-inverting input of the transconductor 402.

The gain of the $g_m/C$ gain stage 208-B is a function of the transconductance ($g_m$) of the transconductor 402 and the impedance of the output capacitor 406. Mathematically, the gain of the $g_m/C$ gain stage 208-B can be shown to be:

$$gain_{208-B} = g_m \cdot \frac{1}{sC_{406}} \quad \text{Eq. 10}$$

$$= g_m \cdot \frac{1}{2\pi j f C_{406}} \quad \text{Eq. 11}$$

where f represents a frequency of an input signal to the gain stage 208-B and $C_{406}$ represents a capacitance of the capacitor 406.

Eq. 11 reveals that the gain of the $g_m/C$ gain stage 208-B increases as the frequency of the signal applied to the $g_m/C$ gain stage 208-B decreases. As a result, the $g_m/C$ gain stage 208-B behaves like the integrator gain stage 208-A depicted in FIG. 3 for low frequencies. Accordingly, the $g_m/C$ gain stage 208-B drives any error between the converter current 216 and the reference current 218 to zero over time. In this way, the $g_m/C$ gain stage 208-B, like the integrator gain stage 208-A, provides an output signal 202 locked to the time constant of the frequency-lock clock generator 200. Accordingly, Eqs. 8 and 9 also specify the frequency of the output clock signal 202 when the alternative embodiment of the frequency-locked clock generator 200 depicted in FIG. 4 is in lock.

The embodiments of the frequency-locked clock generator 200 depicted in FIG. 3 and FIG. 4 can be calibrated to a known digital clock. By doing so, the frequency of the output signal 202 can be calibrated to within 1% of a desired output frequency. Furthermore, the resistance of the reference current source 206 and the capacitance of the F2I converter 204 can be fabricated to have low temperature coefficients. In doing so, the frequency-locked clock generator 200 of the present invention provides tolerance to temperature drift.

FIG. 5 provides a flowchart 500 that illustrates operational steps for generating a frequency-locked clock signal in accordance with an aspect of the invention. The invention is not limited to this operational description. Rather, it will be apparent to persons skilled in the relevant art(s) from the teachings herein that other operational control flows are within the scope and spirit of the present invention. In the following discussion, the steps in FIG. 5 are described.

At step 502, an initial clock signal is generated. The initial clock signal can be generated by a VCO that produces a periodic waveform. The frequency of the periodic waveform may be varied about some free-running frequency.

At step 504, a feedback signal based on the clock signal is generated. The frequency of the feedback signal is proportional to the frequency of the output clock signal. When the clock signal is used as the feedback signal, the frequency of the feedback signal is equal to the frequency of the clock signal. Alternatively, when the clock signal is frequency-divided to produce the feedback signal, the frequency of the feedback signal is a fraction of the frequency of the clock signal. The clock signal can be divided by a divider ratio, N, where N is a positive integer.

At step 506, a converter current is generated. The converter current is generated based on the frequency of the feedback signal. Specifically, the converter current is proportional to the frequency of the feedback signal. The converter current can be generated by a circuit that generates an average output current having a value that is proportional to the frequency of the feedback signal. For example, a switched capacitor circuit can be used to generate the converter current. The F2I converter 204, as described in relation to FIG. 3, for example, can be used to produce the converter current.

At step 508, the converter current is compared to a reference current to determine an error signal. The reference current can be generated using a reference current source. The reference current source can be generated using a reference resistance and a reference voltage. A transistor, such as a MOSFET, can be configured to provide the reference resistance.

The error signal provides an indication whether the converter current is greater than, less than or equal to the reference current. The error signal can be generated by applying the reference current and the converter current to a circuit that compares the two currents. For example, the error signal can be generated by applying the converter current and the reference current to the summing node (i.e., inverting input) of the op-amp 314 depicted in FIG. 3 or the transconductor 402 depicted in FIG. 4.

At step 510, a control signal is generated based on the error signal. The control signal can be, for example, an averaged value of the error signal and can be produced by integrating the value of the error signal over a programmable or adjustable amount of time.

At step 512, the control signal is used to adjust the frequency of the clock signal. For example, the control signal can be a voltage signal which adjusts a free-running frequency of a VCO used to generate the initial clock signal. The frequency of the clock signal is adjusted in step 512 so as to reduce or minimize the error signal. Further, steps 504-512 can provide a negative feedback control of the frequency of the clock signal. Specifically, the frequency of the clock signal is increased when the converter current is less than the reference current and is decreased when the converter current is greater than the reference current.

Step 514 illustrates the repeated monitoring and frequency adjustment operation provided by the present invention. Specifically, step 514 shows that the present invention provides a method for continuously monitoring and updating the frequency of the clock signal based on the error signal generated in step 508.

The frequency of the clock signal is considered to be in lock (i.e., frequency-locked) when the error signal is substantially equal to zero. When in lock, the steps 504-514 have adjusted the frequency of the clock signal such that it produces a converter current that is substantially equal to the reference current. The frequency of the clock signal can be determined by programming or adjusting the reference current. The reference current can be varied during operation of any of the aforementioned steps.

The flowchart 500 illustrates the operational steps for generating a clock signal without the use or need of a reference frequency signal. By obviating the need for a reference frequency, the speed at which the operational steps depicted in FIG. 5 are executed is not limited by the reference frequency. As a result, the operation steps of FIG. 5 can be executed at a fast enough rate to adequately update the frequency of the clock signal.

FIG. 6 illustrates an alternative embodiment of the frequency-locked generator of the present invention. Specifically, FIG. 6 illustrates a clock generator 600 using a reference input signal 604 and an F2I converter 602 to generate the reference current 218. Together, the reference input signal 604 and the F2I converter 602 provide an alternative to the reference current source 206 depicted in FIG. 2. As shown in FIG. 6, the clock generator 600 does not include the reference current source 206.

The F2I converter 602 can be configured similarly to the F2I converter 204 (e.g., as depicted in FIG. 3). That is, the F2I converter 602 can be configured as a switched capacitor circuit that successively charges and discharges a reference capacitor, $C_{REF}$, using a reference voltage 220. As a result, the F2I converter 602 generates a reference current 218 that is proportional to the frequency of the input signal 604. The frequency of the reference input signal 604 can be considered a reference input frequency, $f_{REF}$. The frequency of the input signal 604 can be varied to accommodate the use of the optional frequency divider 212. In general, the reference current 218 generated by the F2I converter 602 can be shown to be:

$$I_{REF} = C_{REF} \cdot f_{REF} \cdot V_{REF} \qquad \text{Eq. 12}$$

The F2I converters 602 and 204 are operated in a push-pull configuration. Specifically, the F2I converter 202 generates an average converter current 216 that flows into an input of the gain stage 208. In contrast, the F2I converter 602 generates an average reference current 218 that flows away from the input of the gain stage 208. In this way, the input of the gain stage 208 operates as a summer to compare the reference current 218 and the converter current 216 to generate the control signal 222. The remaining constituent components and signals of the clock generator 600 operate or behave as described above in reference to FIG. 2 so as to drive, using negative feedback, any difference between the reference current 218 and the converter current 216 to zero. When the feedback loop of the clock generator 600 is in lock (i.e., the error signal is equal to zero), the frequency of the output signal 202 can be shown to be:

$$I_{REF} = I_{CONV} \qquad \text{Eq. 13}$$

$$C_{REF} \cdot f_{REF} \cdot V_{REF} = C \cdot V_{REF} \cdot \frac{f_{out,202}}{N} \qquad \text{Eq. 14}$$

$$f_{out,202} = \frac{N \cdot f_{REF} \cdot C_{REF}}{C} \qquad \text{Eq. 15}$$

when the frequency divider 212 is used, where C represents a capacitance of capacitor associated with the F2I converter 204. Alternatively, when the frequency divider 212 is absent (e.g., N=1), the frequency of the output signal 202 can be shown to be:

$$f_{out,202} = \frac{f_{REF} \cdot C_{REF}}{C} \qquad \text{Eq. 16}$$

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. A method for generating a clock signal, comprising:
   (a) generating a converter current proportional to a frequency of a feedback signal;

(b) generating a reference current proportional to a frequency of a reference signal;
(c) comparing the converter current to the reference current to determine an error signal;
(d) generating a control signal based on the error signal; and
(e) adjusting a frequency of the clock signal based on the control signal, wherein the frequency of the feedback signal is proportional to the frequency of the clock signal.

2. The method of claim 1, wherein adjusting comprises minimizing the error signal.

3. The method of claim 2, wherein minimizing the error signal comprises increasing the frequency of the clock signal when the converter current is less than the reference current.

4. The method of claim 2, wherein minimizing the error signal comprises decreasing the frequency of the clock signal when the converter current is greater than the reference current.

5. The method of claim 2, wherein the clock signal is frequency-locked when the error signal is substantially equal to zero.

6. The method of claim 5, wherein a frequency of the frequency-locked clock signal is determined by a known time constant.

7. The method of claim 1, further comprising generating the feedback signal based on the clock signal.

8. The method of claim 7, wherein generating the feedback signal comprises frequency-dividing the clock signal such that the frequency of the feedback signal is equal to a fraction of the frequency of the clock signal.

9. The method of claim 7, wherein the frequency of the feedback signal is equal to the frequency of the clock signal.

10. The method of claim 1, wherein comparing comprises applying the converter current and the reference current to an inverting input of an integrator.

11. The method of claim 10, wherein the integrator drives the error signal to zero.

12. The method of claim 1, wherein generating the control signal comprises integrating the error signal.

13. A frequency-locked clock generator, comprising:
(a) means for generating a periodic waveform having a frequency that is adjustable;
(b) means for generating a converter current proportional to the frequency of the periodic waveform;
(c) means for generating a reference current proportional to a frequency of a reference signal;
(d) means for determining a difference between the converter current and the reference current; and
(e) means for generating a control signal to adjust the frequency of the periodic waveform so as to reduce the difference.

14. A frequency-locked clock generator, comprising:
(e) a voltage-controlled oscillator (VCO) to generate an output signal;
(f) a first frequency-to-current converter to generate a converter current proportional to a frequency of the output signal;
(g) a second frequency-to-current converter to generate a reference current proportional to a frequency of a reference signal; and
(h) a gain stage to generate a control signal based on a difference between the converter current and the reference current, wherein the control signal adjusts the frequency of the output signal.

15. The frequency-locked clock generator of claim 14, wherein the first frequency-to-current converter comprises:
(a) a non-overlapping clock generator coupled to the output signal; and
(b) a variable capacitor, wherein the non-overlapping clock generator successively charges and discharges the variable capacitor to generate the converter current.

16. The frequency-locked clock generator of claim 14, wherein the gain stage behaves as an integrator.

17. The frequency-locked clock generator of claim 14, wherein the gain stage drives the difference between the converter current and the reference current to zero.

* * * * *

UNITED STATES PATENT AND TRADEMARK OFFICE
CERTIFICATE OF CORRECTION

| | |
|---|---|
| PATENT NO. | : 7,646,253 B2 |
| APPLICATION NO. | : 11/436570 |
| DATED | : January 12, 2010 |
| INVENTOR(S) | : Kwan et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 334 days.

Signed and Sealed this

Sixteenth Day of November, 2010

David J. Kappos
*Director of the United States Patent and Trademark Office*